United States Patent
Chappaz et al.

(10) Patent No.: US 7,679,261 B2
(45) Date of Patent: Mar. 16, 2010

(54) ELECTROSTATIC ACTUATOR, DEVICE COMPRISING SUCH ACTUATORS, MICROSYSTEM COMPRISING SUCH A DEVICE AND METHOD FOR MAKING SUCH AN ACTUATOR

(75) Inventors: Cedrick Chappaz, Crolles (FR); Claire Divoux, Vancouver (CA)

(73) Assignee: Commissariat a l'Energie Atomique, Paris (FR)

( * ) Notice: Subject to any disclaimer, the term of this patent is extended or adjusted under 35 U.S.C. 154(b) by 857 days.

(21) Appl. No.: 11/472,377

(22) Filed: Jun. 22, 2006

(65) Prior Publication Data

US 2006/0291129 A1      Dec. 28, 2006

(30) Foreign Application Priority Data

Jun. 23, 2005   (FR) .................................. 05 51733

(51) Int. Cl.
*H01L 41/08* (2006.01)
(52) U.S. Cl. .................. 310/309; 359/224; 359/198
(58) Field of Classification Search .................. 310/309
See application file for complete search history.

(56) References Cited

U.S. PATENT DOCUMENTS

| | | | |
|---|---|---|---|
| 6,198,180 B1 | 3/2001 | Garcia | |
| 6,690,885 B1 | 2/2004 | Aksyuk et al. | |
| 2002/0135850 A1 | 9/2002 | Hagelin et al. | |
| 2003/0039016 A1 | 2/2003 | Vaganov | |
| 2004/0032634 A1 | 2/2004 | Hah et al. | |

FOREIGN PATENT DOCUMENTS

| | | |
|---|---|---|
| FR | 2 859 541 | 3/2005 |
| WO | WO 92/22763 | 12/1992 |
| WO | WO 2005/006472 A1 | 1/2005 |

OTHER PUBLICATIONS

U.S. Appl. No. 10/584,202, filed Jun. 23, 2006, Divoux.
U.S. Appl. No. 10/583,718, filed Jun. 20, 2006, Charton et al.
U.S. Appl. No. 10/583,719, filed Jun. 20, 2006, Divoux et al.
Jens Branebjerg, et al., "A New Electrostatic Actuator provinding improved Stroke Length and Force", Feb. 4-7, 1992, pp. 6-11.

*Primary Examiner*—Mark Budd
(74) *Attorney, Agent, or Firm*—Oblon, Spivak, McClelland, Maier & Neustadt, L.L.P.

(57) ABSTRACT

An electrostatic actuator including: at least one fixed electrode, fixed with respect to a substrate; at least one flexible electrode arranged to face the substrate; a pivot member extending from the flexible electrode, the pivot member being fixed to a face of the flexible electrode facing the fixed electrode, and the pivot member being made from a conducting material; and at least one suspending unit suspending the flexible electrode and holding the flexible electrode at rest at a distance from the substrate, wherein the suspending unit and the pivot member are different.

27 Claims, 10 Drawing Sheets

ELECTROSTATIC ACTUATOR, DEVICE COMPRISING SUCH ACTUATORS, MICROSYSTEM COMPRISING SUCH A DEVICE AND METHOD FOR MAKING SUCH AN ACTUATOR

This invention relates to micro electro-mechanical systems (MEMS). More particularly, the invention relates to an electrostatic actuator used in this type of system, to devices comprising such an actuator and to a method for making such an actuator.

A "progressive closing or zipping" type actuation is a particular electrostatic actuation in which a mobile electrode comes into contact with or is forced into contact with an insulator separating it from a fixed electrode, this movement taking place progressively and almost linearly with the applied voltage.

Known devices operating based on this principle are described in the article by J. Gravesen et al. <<A New Electrostatic Actuator providing improved Stroke length and Force>>, MEMS'92 and in document WO 92/22763.

These devices enable displacements around a rotation axis, or along a translation axis.

Furthermore, this type of device requires voltages of several tens of volts for rotations of a few degrees.

Document US 2002/0135850 describes a device that can be used for displacements with a greater amplitude than other devices. This is done by forming the device from a sequence of actuators of a known type, that in operation amplify the initial displacement. This type of device is relatively complex.

There are also electrostatic actuators comprising a means forming a pivot for the flexible electrode, this pivot being fixed with respect to a fixed electrode, which then enables a vertical displacement for the free end of the flexible electrode and amplifies the displacement. However, this device cannot be used to obtain different displacement types with a single actuator. Furthermore, the actuation voltage of such actuators is approximately the same as actuators without a pivot.

Consequently, one of the purposes of this invention is to propose an electrostatic actuator capable of achieving displacements in all directions and also obtaining a large displacement with a small actuation voltage.

DESCRIPTION OF THE INVENTION

The purpose stated above is achieved by an actuator comprising a flexible electrode, a fixed electrode with respect to the substrate, and a means forming a pivot for the flexible electrode, the means forming the pivot being fixed to the flexible electrode and made of a conducting material. The flexible electrode also comprises means of suspension of the said electrode from the substrate. The distance between the fixed electrode and the pivot is less than the distance between the fixed electrode and the mobile electrode, therefore the actuation voltage is smaller.

The main purpose of this invention is then an electrostatic actuator comprising:
  at least one fixed electrode with respect to a substrate,
  at least one flexible electrode arranged facing the substrate,
  at least one means forming the pivot of the flexible electrode, the said means being fixed to the flexible electrode on its face facing the fixed electrode,
  at least one means of suspension of the flexible electrode, holding the said flexible electrode at rest at a distance from the substrate.

Advantageously, the suspension means is formed from a suspension beam fixed at one end to a support projecting from the substrate.

In one particular embodiment, the means forming the pivot is shaped like a pad.

In one particular embodiment, one face of the flexible electrode opposite the facing face of the fixed electrode, is designed to support an object to be moved.

Preferably, the flexible electrode and/or the fixed electrode is (are) coated with a layer of a dielectric material.

For example, the actuator may comprise two fixed electrodes and two means forming a pivot, each of the fixed electrodes being arranged between one end of the flexible electrode and a means forming a pivot.

Furthermore, another purpose of the invention is an electrostatic actuation device, comprising first and second actuators according to this invention.

In one particular embodiment, the flexible electrodes of the two actuators are suspended by the associated suspension means from a common support projecting from the substrate.

In another particular embodiment, the electrostatic actuation device comprises at least one actuator of the first type according to the invention, and at least one actuator of the second type comprising a fixed electrode and a flexible electrode held at a distance from the fixed electrode, the said actuators being uniformly distributed at an equal angular spacing.

Advantageously, the suspension means are distributed at an equal angular spacing between the actuators.

For example, the device comprises three actuators of the first type and three actuators of the second type, arranged alternately. There may be three suspension means distributed at an equal angular spacing between an actuator of the first type and an actuator of the second type.

Advantageously, the flexible electrodes of the actuators of the first type and the second type zigzag between their first and their second ends.

In another particular embodiment, the actuators of the first type and the second type are arranged on each side of an axis fixed at one end to the object to be moved and forming a suspension means.

In this particular embodiment, the device may comprise a plurality of actuators of the first type and the second type on each side of the axis, arranged alternately parallel to each other.

For example, the adjacent actuators of the first type and the second type are carried by the legs of a U, one U arranged on one side of the axis being connected to another U arranged on the other side of the axis through a central leg fixed to the axis and connecting the bottoms of the U shapes.

The device may comprise at least two axes, advantageously six axes distributed at an equal angular spacing around the object to be moved.

Advantageously, the flexible electrodes are provided with pull-in zones so as to facilitate displacment of the flexible electrodes toward the substrate.

Another purpose of this invention is a microsystem comprising an object to be moved and an electrostatic actuation device according to the invention, for example the object to be moved being a mirror.

Another purpose of this invention is a method for making an electrostatic actuator on a substrate, according to the invention, comprising the following steps:
  a) make at least one fixed electrode on the front face of the substrate,
  b) deposit a sacrificial layer, c) structure the said sacrificial layer to form at least one flexible electrode, at least one suspension means and at least one means forming the pivot, d) deposit a conducting layer and eliminate the sacrificial layer.

Advantageously, an oxide layer is deposited on the front face of the substrate, for example made of silicon oxide, before the fixed electrode is formed.

During step a), a metallic layer is deposited on the oxide and structuring layer by lithography and etching of the said metallic layer.

Preferably, a layer of dielectric material is deposited after the metallic layer has been etched.

Moreover, step c) may be done by double lithography and etching of the sacrificial layer. At the end of step c), the sacrificial layer comprises through channels reaching the insulating layer for the connection between the substrate and the flexible electrode and at least one non-through channel for formation of the means forming the pivot.

BRIEF DESCRIPTION OF THE DRAWINGS

This invention will be better understood after reading the following description and with reference to the attached drawings in which.

DETAILED PRESENTATION OF PARTICULAR EMBODIMENTS

Figure 1A:
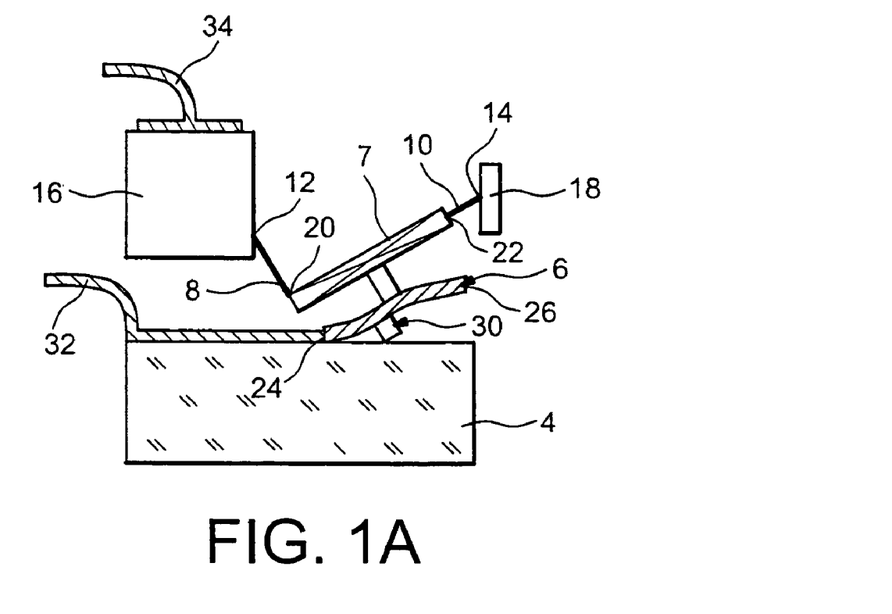
FIG. 1A is a diagrammatic view of a first example of an actuator according to this invention in a first actuated position.

FIG. 1A shows an example embodiment of an actuator according to this invention comprising an electrode 2 fixed with respect to a substrate 4, and a flexible electrode 6 facing the fixed electrode. An object to be moved 7 is fixed to an upper face 9 of the flexible electrode 6.

The actuator also comprises suspension means 11 suspending the flexible electrode from the substrate. In the example shown, the means 11 are formed by first and second suspension beams 8,10 attached by a first end 12,14 to corresponding supports 16,18 and by a second end 20,22 to the object 7.

The beams 8,10 are advantageously arranged coaxially. In other words, if the object 7 is in the shape of a disk, the beams are fixed and are diametrically opposite to the object 7.

The suspension means 11 may comprise a single beam or more than two beams.

The suspension means may be straight or curved depending on the required actuation mode.

The flexible electrode is then held at a distance from the fixed electrode, approximately parallel to it.

The actuator also comprises a means 30 forming a pivot of the flexible electrode, fixed to the said flexible electrode, between the first 24 and the second 26 ends of the flexible electrode 6. The fixed electrode 2 is arranged facing the portion of the mobile electrode 6 located between the first end 24 and the pivot means 30, so as to enable separation of the second end 26 from the flexible electrode of the substrate 4, when the first end 24 moves towards the fixed electrode 2. Due to the lever effect caused by the means 30, the second end 26 has an approximately vertical upwards displacement.

The means forming the pivot is made from a conducting material, advantageously the same as the material forming the flexible electrode, allowing it to participate in displacement of the mobile electrode and to reduce the actuation voltage of the flexible electrode.

Figure 5:
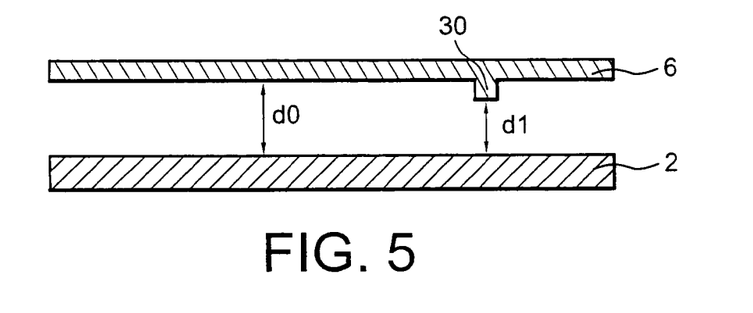
FIG. 5 is a detailed view of an actuator according to this invention.

As can be seen in FIG. 5, the distance d1 separating a lower end of the pivot 30 from the fixed electrode 2 is less than the distance d0 separating the flexible electrode 6 from the fixed electrode 2, and the threshold or actuation voltage is reduced.

Fastening the pad to the flexible electrode also has the advantage that it avoids uncontrolled sliding movements that can take place when the pad is fixed to the substrate. Thus, displacement of the flexible electrode is better controlled.

Advantageously, the flexible electrode and the means forming the pivot are made in a single piece.

In one variant embodiment, the suspension means formed from the beams and the supports are also made in a single piece with the flexible electrode.

The flexible electrode may be in a zigzag shape or in any other shape in order to increase the length of the electrode without increasing its overall axial length. This particular shape provides a means of reducing the actuation threshold voltage as will be described in the remainder of the description.

The suspension beams 8,10 may be fixed directly on the flexible electrode.

The pivot 30 is in the shape of a pad, for example with a parallelepiped shaped section. But other shaped pads are possible.

The use of an actuator provided with a pivot means provides a means of obtaining large displacements with small working voltages.

The fixed and mobile electrodes are connected to a voltage source through conductors 32,34. The voltage could also be varied in only one of the two electrodes 2,6, the other electrode 6,2 being connected to the ground.

Advantageously, the fixed and/or mobile electrodes are coated with an insulating layer to prevent the occurence of short circuits.

The object to be moved 7 may for example be a mechanical load and/or an electrical contact and/or an electrical and/or an optical component, or a mirror and/or a membrane, particularly itself possibly forming a mirror.

In the case of a membrane, the return force is advantageously applied by the membrane to resist the force applied by the actuator, while a specific return element is necessary in known types of actuators.

We will now describe the operation of such an actuator.

When a voltage difference is applied between the flexible electrode 6 and the fixed electrode 2, the flexible electrode moves towards the substrat 4 so that it comes into contact with the substrate 4 and then pivots about the means forming the pivot 30. Thus the actuator has a large amplitude and at the same time a rotating vertical displacement about the pivot 30.

Figure 1B:
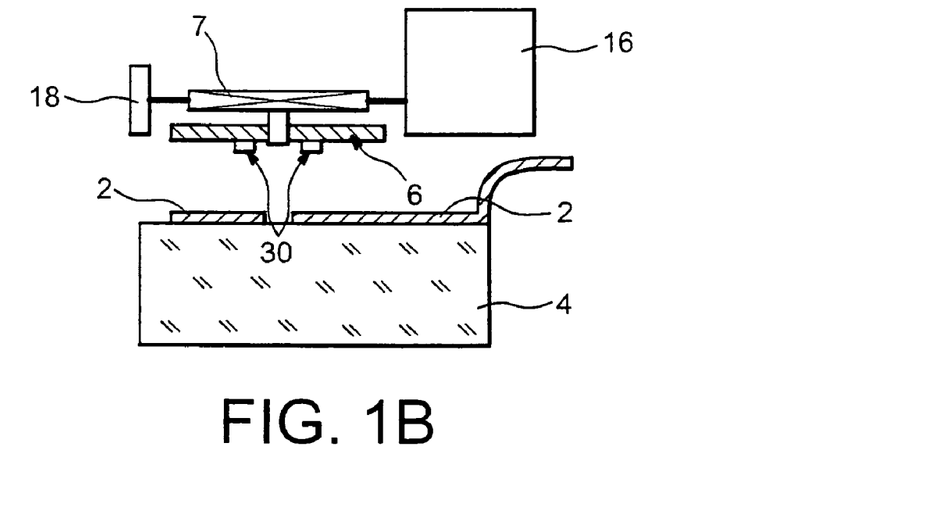
FIG. 1B is a diagrammatic view of a second example of an actuator according to this invention, in the rest position, FIG. 1B' is a diagrammatic view of the actuator in FIG. 1B in an actuated position.

In FIG. 1B, the actuator comprises two means forming the pivot 30 arranged symmetrically on each side of a median axis of the flexible electrode, and two fixed electrodes 2. Thus, it is possible to orient the object 7 about two rotation axes parallel to the plane of the sheet and passing through the pivots 30.

It is also possible to move the object 7 parallel to the plane of the substrate. When the two ends of the flexible electrode 6 are subject to the same voltage difference at the same time with respect to the fixed electrode facing it, the mobile electrode 6 is attracted towards the substrate 4 or is pushed away from the substrate 4 moving parallel to the plane of the substrate 4 (FIG. 1B').

Consequently, the object 7 may have different displacements by combining the displacements described above.

Figure 1C:
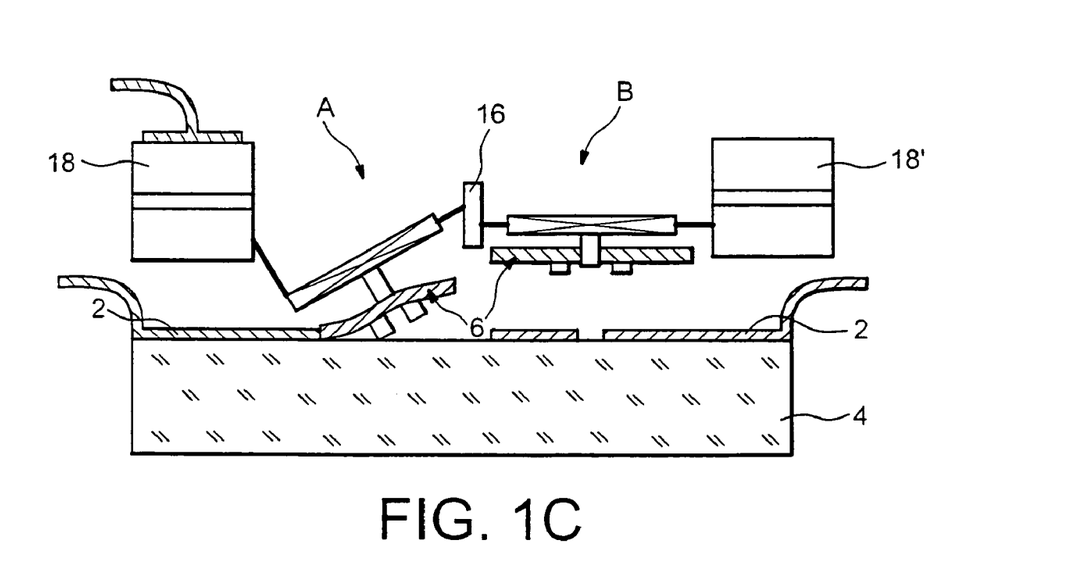
FIG. 1C is a diagrammatic view of a first embodiment of a device according to this invention, partly actuated.

FIG. 1C shows an electrostatic actuation device comprising two actuators A,B according to this invention. The two actuators have the structure described above. In the example shown, the two actuators are suspended at one end from a corresponding support 18,18', and at a second end from a common support 16. Each actuator can have distinct supports. The operating mode of each actuator is identical to that described above.

Addressing means are provided to independently control the two fixed electrodes in the example shown in FIG. 1B, and the two actuators in the example shown in FIG. 1C.

The addressing means may act at the fixed electrodes, at the mobile electrodes or at the fixed and the mobile electrodes. Non-addressed electrodes are usually at the ground potential.

Figure 2A:
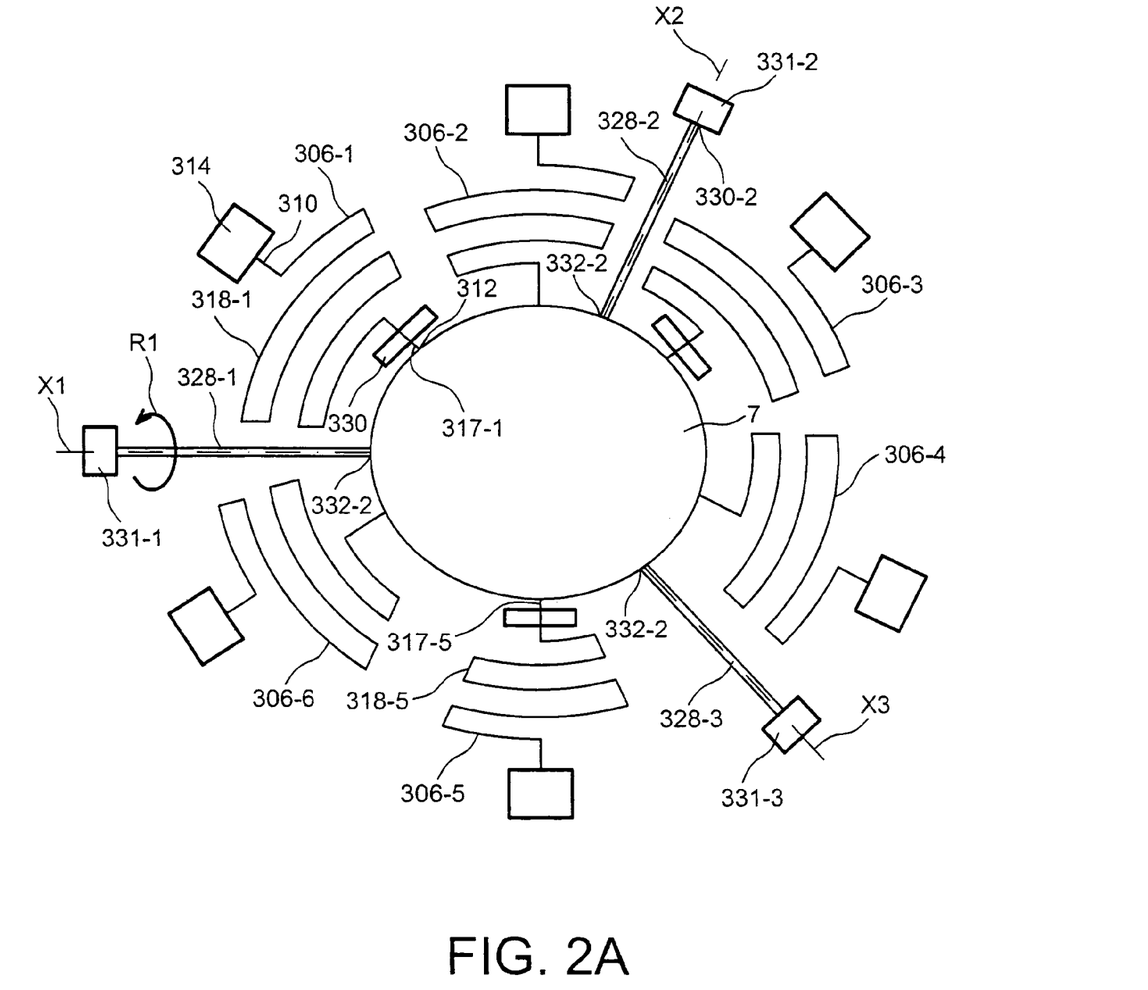
FIG. 2A is a top view of a first example of a device according to a second embodiment.

FIG. 2A shows another embodiment of an electrostatic actuation device according to this invention comprising six flexible electrodes, the displacement of each of the three electrodes 306.1, 306.3 and 306.5 (the "first electrodes") is amplified by a pivot 330, which is not the case for the other electrodes 306.2, 306.4, 306.6 (the "second electrodes"). The first and second electrodes are distributed alternately and at a uniform angular spacing around an object 7 to be moved, for example a mirror.

The first electrodes are all practically identical, and the second electrodes are all practically identical, therefore we will describe the first electrode 306.1 and the second electrode 306.2.

The flexible electrode 306.1 is kept suspended from the substrate by a first end 310 fixed to a support 314, and by a second end 312 fixed to the object to be moved 7.

The first end 310 is provided with a pull-in zone to facilitate movement of the flexible electrode 306.1 towards a fixed electrode on the substrate (not shown) arranged facing the flexible electrode 306.1.

The pivot means 330 is inserted between the flexible electrode and the fixed electrode, fixed with respect to the flexible electrode 306.1, and delimits an area 318.1 between the support 314 and the pivot 330 and an area 317.1 between the pivot 330 and the object 7.

The flexible electrode 306.2 is identical to the electrode 306.1, however there is no pivot means 330 between the flexible electrode 306.1 and the fixed electrode.

Advantageously, the flexible electrodes 306.1 to 306.6 zigzag between their first ends 310 and second ends 312 respectively, thus providing more flexibility during their deformation, and a better sensitivity of the actuator.

Figure 6:
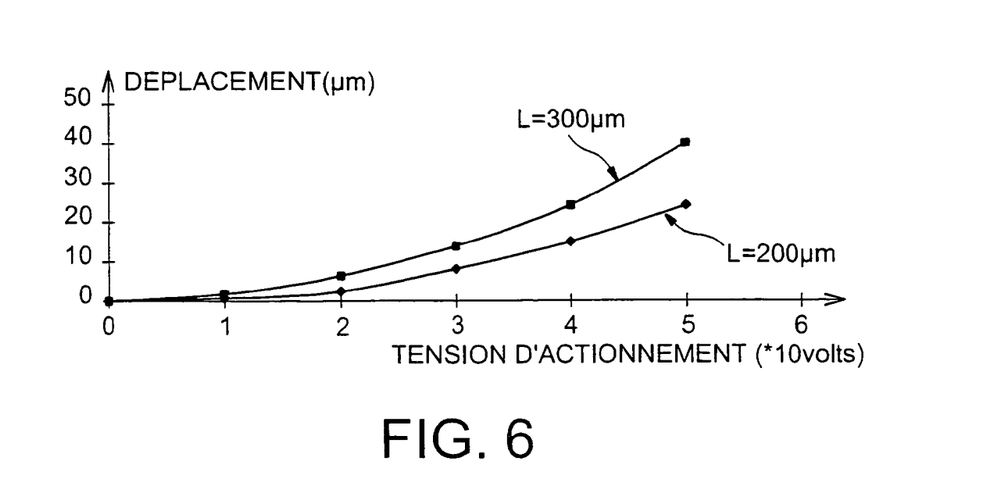
FIG. 6 is a graphic representation of the variation of the displacement of a flexible electrode as a function of the applied voltage for electrodes with different lengths.

Furthermore, this electrode shape reduces the actuation threshold voltage. It has been observed that as the length of the mobile electrode increases, the stored electrostatic energy also increases and a lower voltage is necessary to force the flexible electrode into contact with the mobile electrode. FIG. 6 shows the displacement of a 300 µm long electrode and a 200 µm long electrode as a function of the voltage, and it can be seen that the displacement of the largest electrode is significantly greater than the displacement of the smaller electrode.

Any other shape could be used for increasing the length without increasing the overall dimension of the flexible electrode, for example a curved or spiral shape.

Figure 2B:
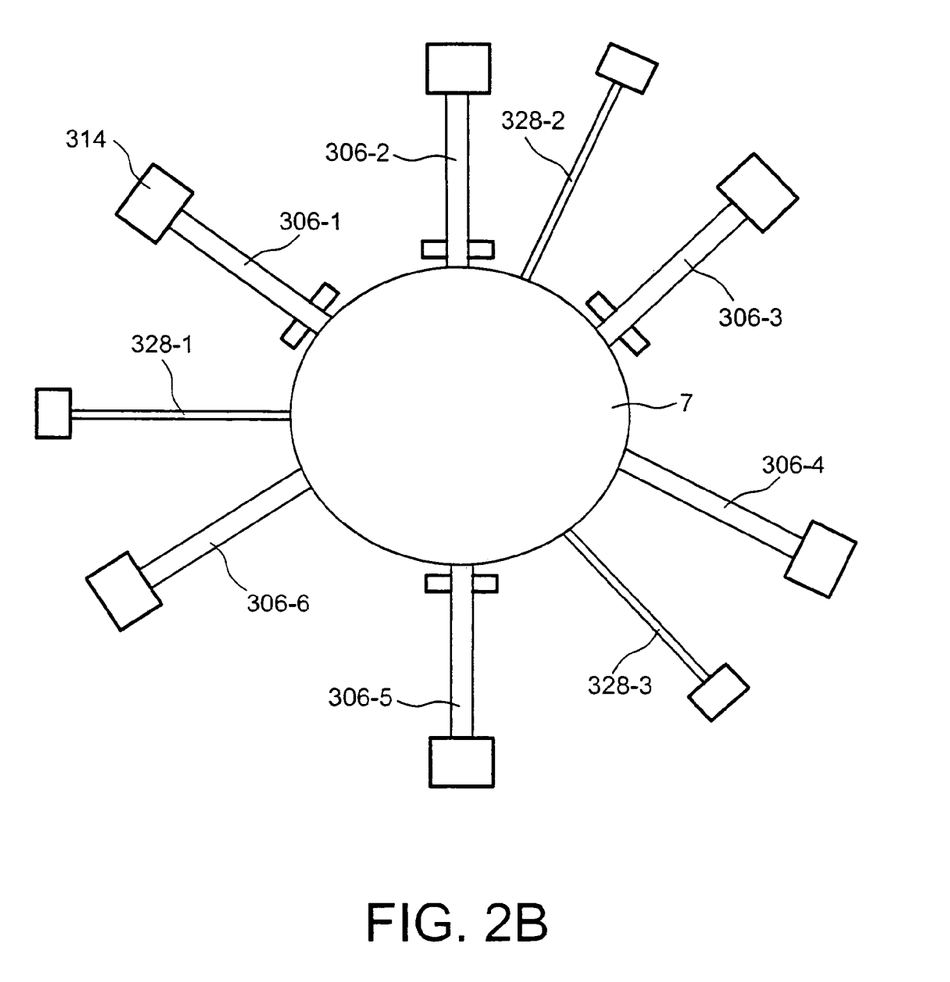
FIG. 2B is a top view of a second example of a device according to the second embodiment.

FIG. 2B shows an electrostatic actuation device with approximately the same structure as that of the device shown in FIG. 2A, however the flexible electrodes 306.1 to 306.6 are in the form of a parallelepiped shaped tongue.

For guidance, the length of a flexible electrode may be between 50 µm and 800 µm, and when provided with a pad, it may have a movement distance of between 1 µm and 10 µm upwards.

Advantageously, the device also comprises suspension arms 328.1, 328.2, 328.3, (three arms in the mode shown) that are attached by a first end to a support 331.1, 331.2 and 331.3 projecting from the substrate, and by a second end 332.1, 332.2, 332.3 to the object 7. When at rest, they define a position of the object.

Advantageously, each suspension arm is arranged at an equal angle between a flexible electrode provided with a pivot means and a flexible electrode without a pivot means.

The suspension arms are advantageously arranged approximately orthogonally to the first and second actuators so as to form rotation axes X1, X2, X3. These arms 330.1 to 330.3 are then subjected to torsion torque when they are rotated.

We will now explain the operation of such a device.

When a voltage difference is applied between the flexible electrode 306.1 and the associated fixed electrode (not shown) able to attract the flexible electrode towards the substrate, area 318 moves towards the fixed electrode causing the portion 317 and the second end 312 to move away from the flexible electrode 306.1. The object 7 is lifted. When the same voltage difference is applied between each flexible electrode 306.1, 306.3 and 306.5 and its associated fixed electrode, the object moves along an axis approximately orthogonal to the plane of the support moving towards or away from the substrate depending on the sign of the potential difference.

When a voltage difference is applied between the flexible electrode 306.2 and its associated fixed electrode, able to attract the mobile electrode 306.2 towards the substrate, the object 7 is lowered. When the same voltage difference is applied between each electrode 306.2, 306.4 and 306.6 and its associated fixed electrode, the object then moves along an axis approximately orthogonal to the plane of the support moving towards or away from the substrate depending on the sign of the voltage difference. These displacements have a lower amplitude than displacements caused by actuation of electrodes 306.1, 306.3 and 306.5 when the same potential difference is applied to them.

All that is necessary to obtain the required displacement is to actuate one or several flexible electrodes among electrodes 306.1 to 306.6.

We will now consider electrodes 306.2 and 306.5.

When a potential difference is applied between the mobile electrode 306.5 and the associated fixed electrode, able to attract the mobile electrode 306.5, and a voltage difference is applied between the electrode 306.2 and the associated fixed electrode, able to attract electrode 306.2 towards the substrate, the object 7 pivots about the axis X1 in the direction of the arrow R1. The direction of rotation may be inverted by inverting the potential differences.

Addressing means (not shown) are provided to actuate one or several actuators.

The addressing means may act at the fixed electrodes, at the mobile electrodes 306.1, 306.2, 306.3, 306.4, 306.5 and 306.6 or at the fixed and the mobile electrodes. Non-addressed electrodes are usually at the ground potential.

If addressing is done on fixed electrodes, all the mobile electrodes may be made in a single piece, while if the addressing is done on the mobile electrodes, all the fixed electrodes may be made in a single piece.

Figure 3:
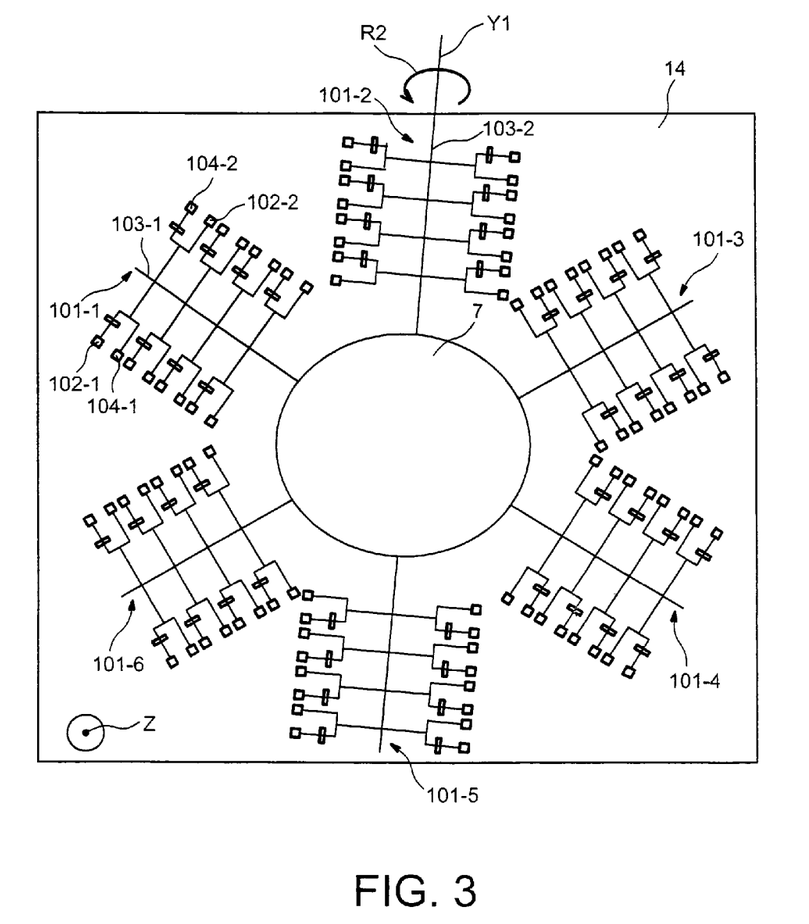
FIG. 3 is a top view of a third embodiment of an actuation device according to this invention.

FIG. 3 shows an actuation device comprising several actuators according to this invention, and the actuators are connected to the object to be moved by an arm.

The device according to the third embodiment comprises six actuation arms 101.1, 101.2, 101.3, 101.4, 101.5, 101.6 distributed at an equal angular spacing around the object to be moved. Thus, the arms 101.1-101.4, 101.2-101.5, 101.3-101.6 are arranged in pairs approximately diametrically opposite to each other.

In the embodiment shown, all arms are approximately identical, consequently we will simply describe the arm 101.1.

The arm 101.1 comprises first actuation elements 102.1, 102.2 and second actuation elements 104.1,104.2 on each side of its axis. The arm 101.1 comprises the same number of first actuators and second actuators on each side, arranged alternately and parallel to each other, such that a first actuator approximately faces a second actuator. Thus, it is possible to balance the force applied on one arm and also to facilitate the movement. When one of the arms 104.2 moves upwards on one side, the arm 102.1 on the other side of the axis moves downwards.

In this embodiment, the flexible electrodes are formed by approximately parallelepiped shaped tongues. In one variant embodiment, the actuators may comprise flexible electrodes in zigzag or in any other shape as described above.

Advantageously (FIG. 3a), the arm 101.1 comprises subassemblies E1, E2, E3, E4 of four actuators connected to an axis 103.1. We will only describe the subassembly E1. E1 comprises four actuators 102.1,102.2,104.1,104.2, a first 102.1,102.2 and a second 104.1,104.2 actuator on each side in the example shown having a common flexible electrode 106. The electrode 106 is suspended between the axis 103.1 and supports 114 projecting from the substrate.

Each actuator may have a separate flexible electrode attached to the axis through an intermediate support.

Figure 3A:
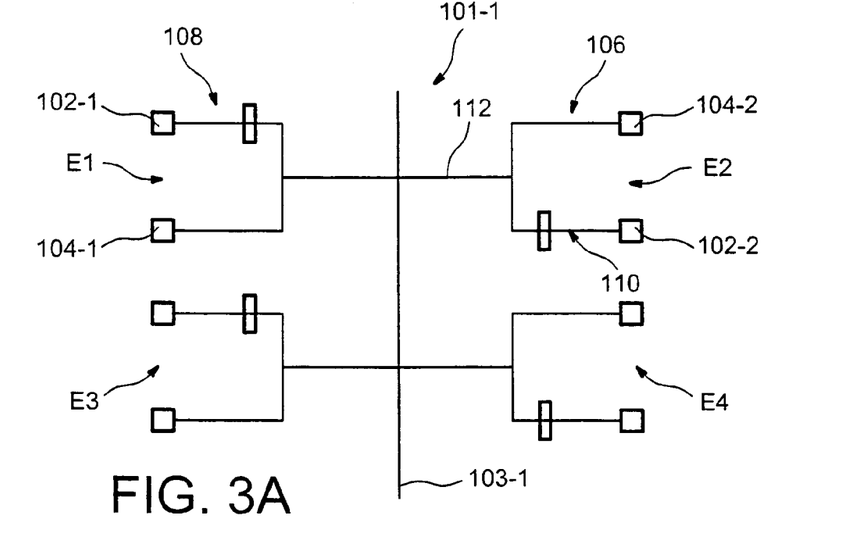
FIG. 3A is a view of a detail in FIG. 3, FIGS. 4A to 4K show steps in a method according to the invention.

The flexible electrode 106 comprises a first U shaped part 108 supporting the actuators 102.1 and 104.1 on each of its legs, and a second U shaped part 110 supporting actuators 102.2 and 104.2. A central leg 112 fixed to the axis 103.1 approximately at its median part, connects the first part 108 and the second part 110 such that they are advantageously symmetric about the axis 103.1.

The free ends of each U are connected to a support 114 projecting from the substrate.

In this embodiment, addressing is done by the fixed electrodes so as to enable individual control of actuators 102.1, 102.2, 104.1, 104.2.

For example, the length of an actuator may be about 20 μm and the distance separating two actuators may be equal to about 10 μm.

We will now describe operation of the actuation device according to the third embodiment.

When a voltage difference is applied between the flexible electrodes and the fixed electrodes of the first actuators of the arm 101.1, able to attract the mobile electrode towards the substrate, the arm is moved away from the support due to the lever effect caused by the pivots. The object 7 then pivots around an axis approximately orthogonal to axis 103.1.

When the same voltage difference is applied between each mobile electrode and its associated fixed electrode, all the first actuators of the six actuation arms are then actuated, the object then moves along a Z axis approximately orthogonal to the plane of the support moving away from or towards the support depending on the sign of the voltage difference.

We will now consider arms 101.2 and 101.5 in more detail.

The object 7 can be rotated about the axis Y1 passing through axes 103.2 and 103.5 by simultaneously actuating all the first actuators. The actuators are located on the same side of the axes 103.2 and 103.5 are actuated so as to cause the same movement at the end of the flexible electrode attached to the axes 103.2 and 103.5. For example, the actuators placed on the left side of the axes 103.2 and 103.5 in the figure are actuated so as to move the ends of the mobile electrodes towards the substrate and the actuators arranged on the right side of the axes 103.2 and 103.5 in the figure are actuated so as to move the ends of the flexible electrodes attached to axes 103.2, 103.5 away from the substrate. The object 7 then turns in the direction shown by the arrow R2.

The direction of rotation can be inverted by modifying the applied voltage differences.

Some actuators can then be actuated to obtain the required displacement.

Advantageously, the diametrically opposite arms 102.1-102.4, 102.2-12.5, 102.3-102.6 are actuated simultaneously, which gives a precise movement.

This device provides a means of obtaining even more precise and better-controlled displacements than those obtained with the actuator according to the second embodiment.

A device can be provided in which the actuation arms only comprise first actuators or second actuators and these arms could be distributed uniformly around the object to be moved.

We will now describe a method for making an actuator according to this invention.

The manufacturing method comprises the following main steps:

a) manufacture at least one fixed electrode on the front face of the substrate, b) deposit a sacrificial layer, c) structure the said sacrificial layer to form at least one flexible electrode, at least one suspension means and at least one means forming the pivot, d) deposit a conducting layer and eliminate the sacrificial layer.

We will give a detailed description of the method for making a device according to this invention.

Figure 4A:
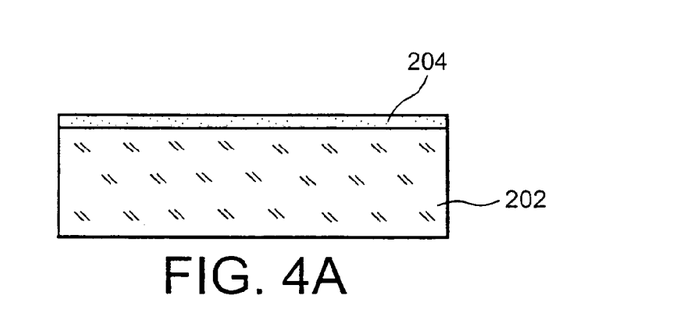

In a first step (FIG. 4A), the front face of a substrate 202, for example a silicon type substrate, is coated with a layer 204 of oxide (SiO2).

Figure 4B:
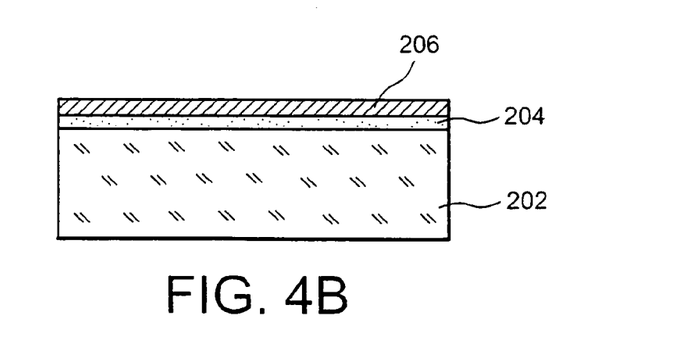

In a second step (FIG. 4B), the oxide layer 204 is coated with a conducting layer 206, for example made of a metal such as aluminium, gold, copper or platinum, or polysilicon.

Figure 4C:
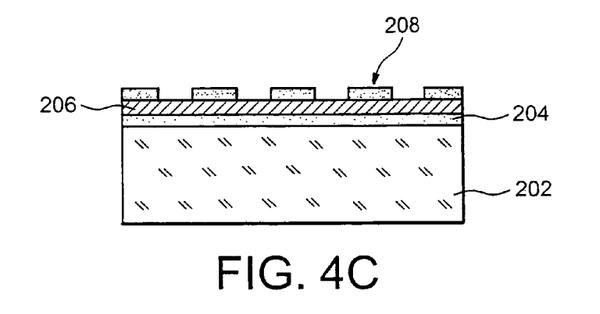

A lithography mask 208 (FIG. 4C) made of resin is then formed on the metallic layer 206, after which the metallic layer 206 is etched, and the mask 208 is eliminated.

Figure 4D:
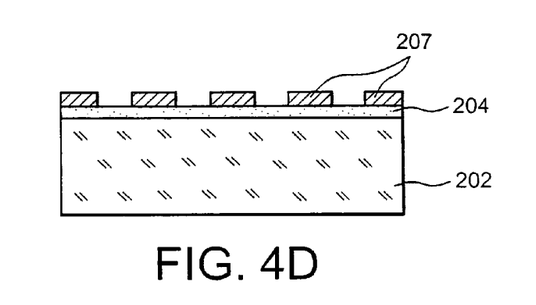

The result is thus a substrate provided with an oxide layer on which metallic strip-shaped areas 207 are formed parallel to each other (FIG. 4D), forming the fixed electrodes. FIG. 4D' shows the substrate seen from above, the fixed electrodes 207 in the example being connected to electrical connection pins 203 that may or may not be made simultaneously.

A layer of insulating material (not shown) for example made of SiN or $SiO_2$ is then deposited on the metallic strips.

Figure 4E:
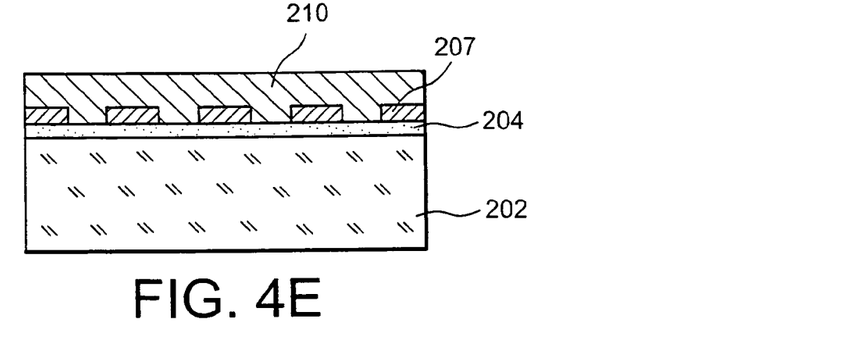

A sacrificial layer 210 is then deposited on the front face on the etched metallic layer (FIG. 4E).

Figure 4F:
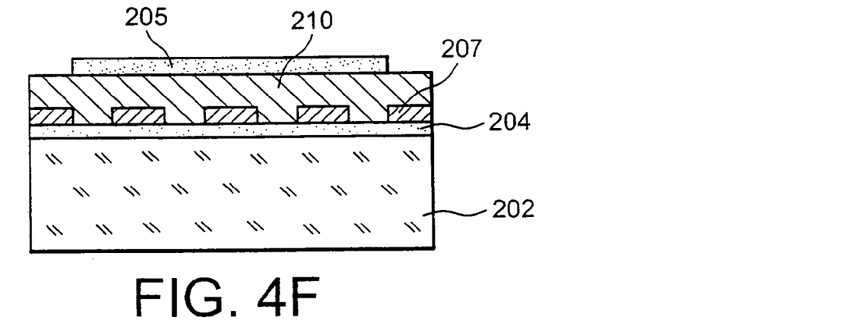
Figure 4G:
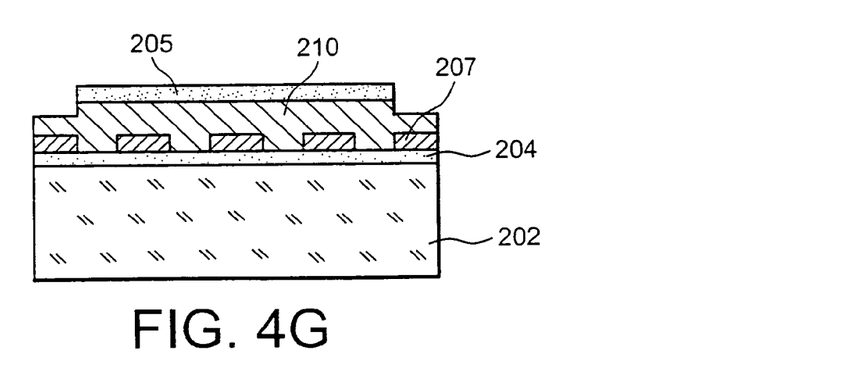

A resin layer 205 is then deposited on the sacrificial layer and a first lithography (FIG. 4F) is made so as to expose the end parts of the sacrificial layer 210 to enable partial etching of the sacrificial layer (FIG. 4G).

Figure 4H:
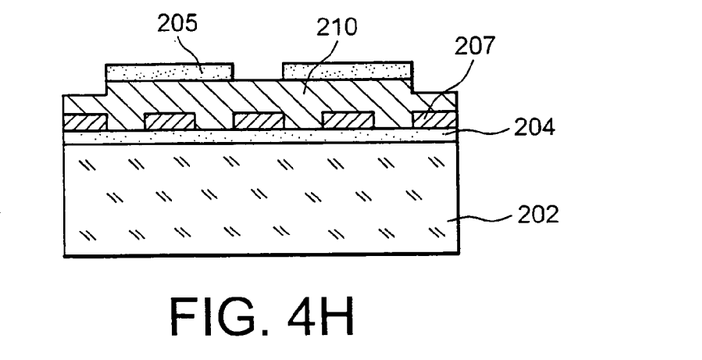

A second lithography is then made on the resin layer 205 to expose a central part of the sacrificial layer 210 (FIG. 4H).

Figure 4I:
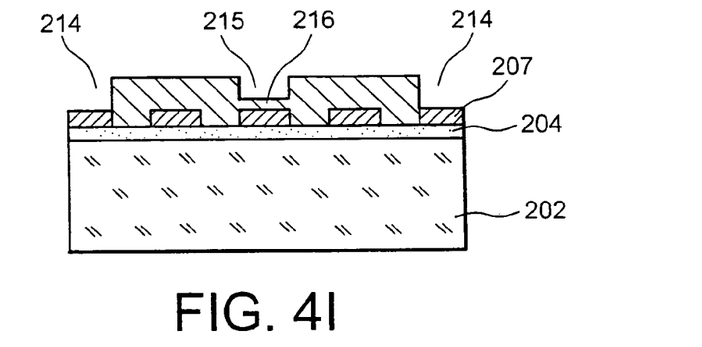

A final etching of the sacrificial layer 210 is done so as to form a channel 215. Channels extending perpendicular to the substrate are thus formed in the sacrificial layer 210, the channels 214 pass through and reach the metallic strips 207. The channel 214 forms a thin sacrificial layer 116 (FIG. 4I). For example, the sacrificial layer may be an $SiO_2$ type oxide or a resin.

In a next step, a conducting layer 218 is deposited on the sacrificial layer. For example, this layer may be a polysilicon. The layer 218 covers the sacrificial layer and fills channels 214 and 215 (FIG. 4J).

Figure 4J:
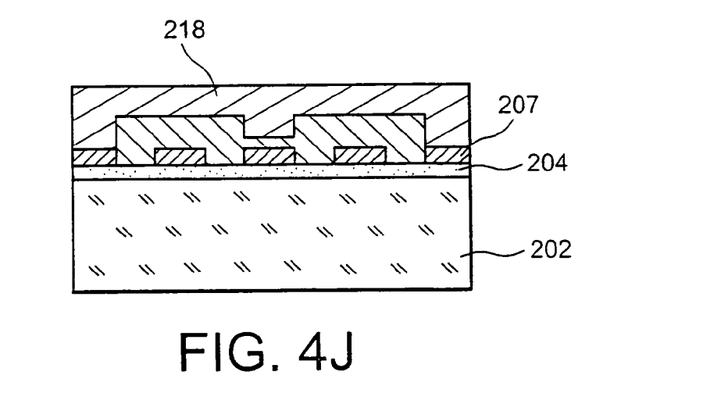
Figure 4K:
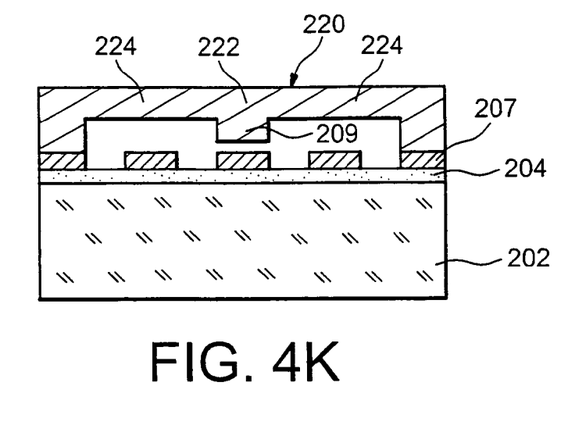

The sacrificial layer is then etched, and the polycrystalline silicon layer forms bridges 220 (FIG. 4K). The bridge 220 comprises first and second feet 207 resting on the substrate and a third foot 209 separated by a small distance from the substrate. The bridge forms the flexible electrode 222 and the suspension beams 224, the first and second feet 207 forming the supports of the suspension arms. The third foot 209 forms the pivot means.

Finally, electrical connection means are made for the flexible and fixed electrodes. Advantageously, they are made on the front face of the object to be moved for flexible electrodes, and directly in the substrate for fixed electrodes deposited on the substrate.

The method according to this invention can be used to simultaneously make a large number of single structures as shown in FIG. 4J, in order to obtain devices according to the different embodiments described above.

The pad forming the pivot means may be deposited at the same time as the flexible electrode or separately, however the production time will be longer if it is deposited separately.

This method can be used to make actuators with very small dimensions of a few hundred μm, enabling a high integration rate.

For guidance, the thickness of the layers may vary from between 500 nm and 2 μm.

This invention is applicable mainly to micro-systems, particularly Micro-Electro-Mechanical Systems (MEMS) and particularly to systems using a mobile mirror.

The invention claimed is:

1. An electrostatic actuator comprising:
   at least one fixed electrode, fixed with respect to a substrate;
   at least one flexible electrode arranged to face the substrate;
   a pivot member fixed to a face of the flexible electrode facing the fixed electrode, and said pivot member being made from a conducting material; and
   at least one means for suspending the flexible electrode and holding said flexible electrode at rest at a distance from the substrate,
   wherein the means for suspending and the pivot member are different.

2. The electrostatic actuator according to claim 1, wherein the means for suspending includes a suspension beam fixed at one end to a support projecting from the substrate.

3. The electrostatic actuator according to claim 1 or claim 2, wherein the pivot member is pad shaped.

4. The electrostatic actuator according to claim 1 or claim 2, wherein the flexible electrode at least partly zigzags between first and second ends of the flexible electrode.

5. The electrostatic actuator according to claim 1 or claim 2, wherein another face of the flexible electrode opposite the face of the flexible electrode facing the fixed electrode is configured to support an object to be moved.

6. The electrostatic actuator according to claim 1 or claim 2, wherein at least one of the flexible electrode or the fixed electrode is coated with a layer of a dielectric material.

7. The electrostatic actuator according to claim 1 or claim 2, wherein there are two fixed electrodes and two pivot members fixed to the flexible electrode, each of the two fixed electrodes being arranged between one end of the flexible electrode and one of the pivot members.

8. An electrostatic actuation device, comprising:
   a first electrostatic actuator according to claim 1; and
   a second electrostatic actuator according to claim 1.

9. The electrostatic actuation device according to claim 8, wherein the flexible electrode of the first electrostatic actuator and the flexible electrode of the second electrostatic actuator are suspended by their respective means for suspending from a common support projecting from the substrate.

10. An electrostatic actuation device comprising:
    at least one first electrostatic actuator according to claim 1; and
    at least one second actuator including a second fixed electrode, and a second flexible electrode held at a distance from the second fixed electrode, wherein said at least one electrostatic actuator and said second actuator are uniformly distributed at an equal angular spacing.

11. The electrostatic actuation device according to claim 10, wherein plural means for suspending are distributed at an equal angular spacing between the at least one electrostatic actuator and the second actuator.

12. The electrostatic actuation device according to claim 11, wherein there are three of the first electrostatic actuators and three of the second actuators arranged alternately.

13. The electrostatic actuation device according to claim 12, wherein there are three of the means for suspending distributed at an equal angular spacing between the first electrostatic actuators and the second actuators.

14. The electrostatic actuation device according to claim 11, wherein the at least one first electrostatic actuator and the at least one second actuator are arranged on each side of an axis fixed at one end to the object to be moved, said axis forming a suspension member.

15. The electrostatic actuation device according to claim 14, wherein there are a plurality of the first electrostatic actuators and a plurality of the second actuators on each side of the axis, arranged alternately parallel to each other.

16. The electrostatic actuation device according to claim 15, wherein adjacent actuators of the first electrostatic actuators and the second actuators are carried by a legs of a U shaped member, one leg of the U shaped member being arranged on one side of the axis being connected to another leg of the U shaped member being arranged on the other side of the axis through a central leg fixed to the axis and connecting bottoms of the one leg and the another leg of the U shaped member.

17. The device according to claim 14, wherein there are two or more axes distributed at an equal angular spacing around the object to be moved.

18. The electrostatic actuator according to claim 1, wherein the at least one flexible electrode is provided with a pull-in zone so as to facilitate displacement of the at least one flexible electrode towards the substrate.

19. A microsystem comprising:
an actuator; and
an object to be moved by the actuator, wherein the actuator includes,
- at least one fixed electrode, fixed with respect to a substrate,
- at least one flexible electrode arranged to face the substrate,
- a pivot member fixed to a face of the flexible electrode facing the fixed electrode, and said pivot member being made from a conducting material, and
- at least one means for suspending the flexible electrode and holding said flexible electrode at rest at a distance from the substrate,
- wherein the means for suspending and the pivot member are different.

20. The microsystem according to claim 18, wherein the object to be moved is a mirror.

21. A method for making an electrostatic actuator on a substrate, comprising:
- making at least one fixed electrode on a front face of the substrate,
- depositing a sacrificial layer on the substrate,
- structuring said sacrificial layer to form at least one flexible electrode, at least one suspension member and at least one pivot member, the suspension member being different from the pivot member,
- depositing a conducting layer forming the flexible electrode and the pivot member, and
- eliminating the sacrificial layer.

22. The method according to claim 21, further comprising:
depositing an oxide layer on the front face of the substrate before the fixed electrode is formed.

23. The method according to claim 22, wherein the making the at least one fixed electrode includes depositing a metallic layer on the oxide, forming a lithography mask on the metallic layer, and etching said metallic layer.

24. The method according to claim 23, further comprising:
depositing a layer of dielectric material after the metallic layer has been etched.

25. The method according to claim 21 or 22, wherein the structuring includes applying double lithography and etching of the sacrificial layer.

26. The method according to the claim 21, wherein the structuring includes applying double lithography and etching of the sacrificial layer, and at an end of the structuring, the sacrificial layer comprises through channels reaching an insulating layer for a connection between the substrate and the flexible electrode and at least one non-through channel for formation of the pivot member.

27. The method according to the claim 22, wherein the structuring includes applying double lithography and etching of the sacrificial layer, and at an end of the structuring, the sacrificial layer comprises through channels reaching an insulating layer for a connection between the substrate and the flexible electrode and at least one non-through channel for formation of the pivot member.

* * * * *